(12) United States Patent
Agarwal

(10) Patent No.: US 8,330,090 B2
(45) Date of Patent: Dec. 11, 2012

(54) PHOTOSENSITIVE DEVICE AND METHOD OF MANUFACTURING A PHOTOSENSITIVE DEVICE USING NANOWIRE DIODES

(75) Inventor: Prabhat Agarwal, Brussels (BE)

(73) Assignee: NXP, B.V., Eindhoven (NL)

( * ) Notice: Subject to any disclaimer, the term of this patent is extended or adjusted under 35 U.S.C. 154(b) by 479 days.

(21) Appl. No.: 12/597,263

(22) PCT Filed: Apr. 29, 2008

(86) PCT No.: PCT/IB2008/051652
§ 371 (c)(1),
(2), (4) Date: Oct. 23, 2009

(87) PCT Pub. No.: WO2008/135905
PCT Pub. Date: Nov. 13, 2008

(65) Prior Publication Data
US 2010/0127153 A1      May 27, 2010

(30) Foreign Application Priority Data
May 7, 2007   (EP) ..................................... 07107595

(51) Int. Cl.
*G01J 1/42* (2006.01)
(52) U.S. Cl. .................. 250/208.2; 977/762; 977/763; 977/765; 977/766; 257/12; 257/21
(58) Field of Classification Search .......... 977/762–766; 257/12, 21; 250/208.2
See application file for complete search history.

(56) References Cited

U.S. PATENT DOCUMENTS

| | | | |
|---|---|---|---|
| 6,407,439 B1 | 6/2002 | Hier et al. | |
| 7,666,708 B2 * | 2/2010 | Lieber et al. | 438/99 |
| 2005/0161662 A1 * | 7/2005 | Majumdar et al. | 257/18 |
| 2006/0009003 A1 * | 1/2006 | Romano et al. | 438/382 |
| 2008/0173971 A1 * | 7/2008 | Sharma et al. | 257/506 |
| 2008/0310790 A1 * | 12/2008 | Wu et al. | 385/12 |
| 2010/0078055 A1 * | 4/2010 | Vidu et al. | 136/244 |
| 2010/0295019 A1 * | 11/2010 | Wang et al. | 257/21 |
| 2011/0249322 A1 * | 10/2011 | Wang et al. | 359/344 |

FOREIGN PATENT DOCUMENTS

| | | |
|---|---|---|
| EP | 1703569 A2 | 9/2006 |
| JP | 60091668 | 5/1985 |
| WO | 0077861 A1 | 12/2000 |

OTHER PUBLICATIONS

Agarwal, P., et al; "Breakdown Enhancement in Silicon Nanowire P-N Junctions"; Database Compendex(Online); Engineering Information, Inc, New York, NY, US; Mar. 10, 2007; XP002493266; Database Accession No. E20072010598098 Abstract.

Wang, Jianfang, et al; "Highly Polarized Photoluminescence and Photodetection From Single Indium Phosphide Nanaowires"; Science, Reports, vol. 293; Aug. 2001; pp. 1455-1457; XP-002267967.

(Continued)

*Primary Examiner* — Georgia Y Epps
*Assistant Examiner* — Kevin Wyatt
(74) *Attorney, Agent, or Firm* — Kramer & Amado P.C.

(57) ABSTRACT

A photosensitive device (100), the photosensitive device (100) comprising a substrate (101) and a plurality of vertically aligned nanowire diodes (102 to 105) provided on and/or in the substrate (101).

27 Claims, 5 Drawing Sheets

OTHER PUBLICATIONS

Martensson, T., et al; "Nanowire Arrays Defined by Nanoimprint Lithography"; Nano Letters, vol. 4, No. 4; Mar. 17, 2004; p. 699-702; XP002493168.

Sirbuly, D. J., et al; "Semiconductor Nanowires for Subwavelength Photonics Integration"; Database Inspec (Online) The Institution of Electrical Engineers, Stevenage, GB; Aug. 18, 2005; XP002493172; Database Accession No. 8793674; Journal of Physical Chemistry B ACS, USA; vol. 109, No. 32; Aug. 18, 2005; ISSN: 1089-5647.

Barrelet, Carl J., et al; "Nanowire Photonic Circuit Elements"; Database Compendex (Online); Engineering Information, Inc., New York, NY, US; XP002493170; Database Accession No. E2004478466736 and Nano Lett.; Nano Letters Oct. 2004, vol. 4, No. 10; pp. 1981-1985.

Sirbuly, D. J., et al; "Optical Routing and Sensing With Nanowire Assemblies"; Database Inspec (Online), The Institution of Electrical Engineers, Stevenage, GB; May 31, 2005; XP002493171; Database Accession No. 8503013; and Prceedings of the National Academy of Sciences of the United States of America National Academy of Sciences of the United States of America USA; vol. 102; No. 22; May 31, 2005; pp. 7800-7805; ISSN: 0027-8424.

Thelander, et al; "Nanowire-Based One-Dimensional Electronics"; Materials Today; Elsevier Science; Kidlington, GB; vol. 9, No. 10; Oct. 1, 2006; pp. 28-35; XP005658988; ISSN: 1369-7021.

* cited by examiner

PHOTOSENSITIVE DEVICE AND METHOD OF MANUFACTURING A PHOTOSENSITIVE DEVICE USING NANOWIRE DIODES

FIELD OF THE INVENTION

The invention relates to a photosensitive device.

Moreover, the invention relates to a method of manufacturing a photosensitive device.

Beyond this, the invention relates to methods of using a photosensitive device.

BACKGROUND OF THE INVENTION

Opto-electronic components for silicon integrated circuits are considered for use to distinguish between different wavelengths of incident light. Such components can be used for analyzing the spectrum of various light sources. Conventional planar technology is normally used to manufacture structures showing this effect.

JP 60091668 discloses a planar light-receiving integrated element to give an IC itself characteristics as an optical filter, and to reduce the areas of mounting of elements. This shall be achieved by forming a plurality of photodiodes having different sensitivity to the wavelengths of beams on the same substrate, signal-conditioning output currents from each diode and using several diodes as the elements sensitive only to arbitrary wavelengths.

However, a sufficient photosensitivity of the conventionally manufactured devices cannot be guaranteed.

OBJECT AND SUMMARY OF THE INVENTION

It is an object of the invention to provide a photosensitive device having a sufficient degree of photosensitivity.

In order to achieve the object defined above, a photosensitive device, a method of manufacturing a photosensitive device, and methods of using a photosensitive device according to the independent claims are provided.

According to an exemplary embodiment of the invention, a photosensitive device is provided comprising a substrate and a plurality of vertically aligned nanowire diodes provided on and/or in the substrate.

According to another exemplary embodiment of the invention, a method of manufacturing a photosensitive device is provided, the method comprising forming a plurality of vertically aligned nanowire diodes on and/or in a substrate.

According to still another exemplary embodiment of the invention, a photosensitive device having the above mentioned features may be used for detecting (for instance for analyzing) electromagnetic radiation impinging in a direction being perpendicular to an alignment direction of the vertically aligned nanowire diodes.

According to yet another exemplary embodiment of the invention, a photosensitive device having the above mentioned features may be used for manipulating (for instance for modifying the spectral characteristic of) electromagnetic radiation impinging in a direction being perpendicular to an alignment direction of the vertically aligned nanowire diodes.

The term "photosensitive device" may particularly denote any physical structure that has sensitivity to the presence of photons, that is to say electromagnetic radiation. A radiation-material interaction, which may cause such sensitivity, is absorption.

The term "nanowire diode" may particularly denote a physical structure, particularly a semiconductor structure, which has a diode characteristic, particularly having different zones of different types of conductivity. Such a nanowire diode may have a cathode and an anode, wherein a depletion zone may be formed bridging the anode and the cathode. Particularly, a nanowire diode may have a p-doped region adjacent to an n-doped region with a portion having a lower density of charge carriers in the transition portion between the p-doped region and the n-doped region.

The term "vertically aligned" nanowire diodes may particularly denote that an alignment direction of the nanowire diodes may be essentially perpendicular to a main surface plane of a (planar) substrate such as a silicon wafer or a silicon chip. The extension of the nanowire diodes may be (essentially) parallel to a normal vector characterizing the surface plane of the substrate.

The term "provided on and/or in" the substrate may denote that the photosensitive device may at least partially be formed as a monolithically integrated circuit, with components thereof being deposited on the substrate and other components being integrated therein, for instance using etching procedures.

The term "substrate" may denote any suitable material, such as a semiconductor, glass, plastic, etc. According to an exemplary embodiment, the term "substrate" may be used to define generally the elements for layers that underlie and/or overlie a layer or portions of interest. Also, the substrate may be any other base on which a layer is formed, for example a semiconductor wafer such as a silicon wafer or silicon chip. A portion of the substrate on which nanowires are etched, deposited or grown may be a two-dimensional (essentially) planar surface.

The term "nanowire" may denote a post-like structure having dimensions in the order of magnitude of several nanometers to several thousands of nanometers (and may also cover larger or smaller dimensions). An array of closely neighboured nanowires may serve as an array of light-absorbing structures and may therefore serve as a photosensitive device, since the absorption characteristic of the array is different for photons of different wavelengths. Many different types of nanowires may be used for embodiments of the invention, including semiconducting nanowires (for instance made of silicon, germanium, InP, GaN, etc.), metallic nanowires (for instance nickel, platinum, gold), and nanotubes, particularly carbon nanotubes (intrinsic or doped). Such a nanowire may be an oblong nanowire.

The term "oblong nanowire" may denote that the length of the nanowire is larger, particularly significantly larger, than a dimension perpendicular to the length extension. In other words, typical nanowires may exhibit aspect ratios (the ratio between length to width/diameter) of more than one, particularly of more than 2, more particularly of more than 5, or up to 1000 or more. For instance, a nanowire may have a length of 100 nm and may have a diameter of 30 nm.

The term "electromagnetic radiation" may particularly denote a beam of photons of any appropriate wavelength or any appropriate range of wavelengths. This may include the optical spectrum (for instance the range between 400 nm and 800 nm), but may also include electromagnetic radiation of other wavelengths such as UV, infrared, or even X-rays.

According to an exemplary embodiment of the invention, a photosensitive device may be characterized by the vertical alignment of the nanowire diodes each being sensitive to a specific wavelength portion of electromagnetic radiation, wherein the vertical alignment architecture may simplify the manufacture procedure, may make the device more sensitive to different spectral portions, and may contribute to the miniaturization of the device.

According to an exemplary embodiment of the invention, the semiconductor nanowires may be mono-crystalline, hence having a higher mobility (better speed) and less defects (better signal-to-noise ratio) as compared with solutions in which non-crystalline structures (such as amorphous structures) are used for diode purposes. Furthermore, a parasitic capacitance between different components may be very low in a configuration with vertically aligned nanowires. Furthermore, vertical nanowires may be manufactured easily with varying diameters, which may allow obtaining a proper sensitivity particularly in the blue end of the optical spectrum. Furthermore, using vertically aligned nanowires, a depletion volume may be adjusted properly within broad ranges allowing to obtain a fast device.

According to an exemplary embodiment of the invention, a nanowire silicon photodiode device may be provided. Such a vertical nanowire device may overcome shortcomings of conventional planar technology. One is that the spectral resolution may be significantly improved. Thin nanowires made in a vertical technology may be more sensitive (particularly to the blue and UV part of the spectrum) than conventional planar structures. Embodiments of the invention may overcome these and other shortcomings while maintaining a high degree of manufacturability.

According to an exemplary embodiment of the invention, it is possible to use vertical arrays of nanowire diodes made by CMOS compatible etching technology to form a spectrally sensitive photodetector. A characteristic of such an embodiment is that it is capable of finely resolving the wavelength of the incident light, especially in the blue and violet part of the visible spectrum, since the spectral sensitivity depends on the photodiode diameter.

A photodiode device may be provided being capable of resolving the spectrum of the incident light. Such a device may comprise a vertical array of nanowire photodiodes having distinct diameters, which may allow for an improved spectral resolution, and may be in particular sensitive to the blue and UV part of the spectrum. This may be useful for many applications, for instance in optical detectors for medical imaging, spectral control for solid-state lighting, optical interconnects for on-chip communications, etc.

Embodiments of the invention provide a photodiode system, which has a tuneable response to light. This feature can include an essentially uniform response to light, or band-pass, low-pass and high-pass filters. By adjusting the penetration depth, a response characteristic can be set. For instance, by providing different nanodiodes with different geometrical properties or parameters (such as different values of the thickness) the absorption properties of the individual nanodiodes may be made different making different nanodiodes sensitive to different types of radiation. Furthermore, different geometrical structures like a tapered cylinder or a pyramid can be used to further control the absorption properties of the nanodiodes.

Next, further exemplary embodiments of the photosensitive device will be explained. However, these embodiments also apply to the method of manufacturing a photosensitive device and to the methods of use.

Different ones of the plurality of vertically aligned nanowire diodes may have different diameter dimensions. By adjusting the diameters of different nanowires in a different manner, the sensitivity to different wavelength portions of electromagnetic radiation may be adjusted, since it is believed that there is a physical correlation defining the interaction between the diameter of the "antenna-like" nanowire diodes and the impinging electromagnetic radiation.

The plurality of vertically aligned nanowire diodes may be (essentially) parallel to each other. Therefore, when a common alignment direction of all nanowire diodes is provided, it is possible to impinge electromagnetic radiation from a specific orientation and to have an essentially equal sensitivity regarding to directivity effects, thereby further increasing accuracy of the device.

Each of the plurality of the vertically aligned nanowire diodes may comprise a first (for instance end) portion having a first type of conductivity and may comprise a second (for instance end) portion having a second type of conductivity. The terms "first type of conductivity" and "second type of conductivity" may denote that the charge carriers promoting electric current flowing through such a structure may be of the n-type (such as electrons) or of the p-type (such as holes). In order to achieve a diode characteristic, two end portions (for instance tip portions or also intermediate portions) of the nanowire diodes may have different types of conductivity, for instance one may have a p-type and the other may have an n-type of conductivity. Therefore, the first type of conductivity may be opposite to the second type of conductivity.

The photosensitive device may further comprise a depletion portion between the first (end) portion and the second (end) portion of the nanowire diodes, wherein the depletion portion is capable of absorbing electromagnetic radiation in dependence of the correlation between a value of the diameter of the vertically aligned nanowire and the wavelength of a photon/spectral contribution of the electromagnetic radiation. A depletion portion may be a portion that has a (significant) lower concentration of charge carriers than the adjacent doped first and second end portions. The depletion portion may be the actual sensitive portion of the nanowire diode and may be capable of absorbing electromagnetic radiation.

The substrate may be connected to the first end portion and may have the first type of conductivity. For instance, it is possible that the first end portion and the substrate are both n-doped or are both p-doped. Correspondingly, the second end portion may be p-doped (when the first end portion and the substrate are both n-doped) or may be n-doped (when the first end portion and the substrate are both p-doped) to have the opposite type of conductivity.

An electrically insulating matrix may be provided in which a plurality of vertically aligned nanowire diodes may be embedded. Such an electrically insulating matrix may allow transmission of electromagnetic radiation, for instance may be optically transparent or non-opaque to thereby allow electromagnetic radiation to be detected or to be manipulated to impinge on the nanowire diodes. The embedding matrix may make the sensitive nanowires more robust against mechanical influences. Furthermore, an exemplary embodiment of the electrically insulating matrix is silicon oxide ($SiO_2$), since this material is both CMOS-compatible, electrically insulating and has optical properties that are suitable for embodiments of the invention.

The photosensitive device may comprise an electromagnetic radiation-guiding element adapted for guiding electromagnetic radiation to impinge in a direction being perpendicular to an alignment direction of the plurality of vertically aligned nanowire diodes. Since the nanowires may be specifically sensitive to electromagnetic radiation impinging laterally with respect to an alignment direction of the nanowires, such an electromagnetic radiation guide may contribute to a proper delivery of the electromagnetic radiation signals to be detected or to be manipulated. Examples for such an electromagnetic radiation-guiding element are holographic lenses in combination with waveguides, optical fibers, or (components of) photonic crystals.

Photonic crystals may be denoted as periodic optical (nano) structures that are designed to affect the motion of photons in a similar way that a periodicity of a semiconductor crystal affects the motion of electrons. Photonic crystals are composed of periodic dielectric or metallo-dielectric (nano) structures that are designed to affect the propagation of electromagnetic waves in the same way as the periodic potential in a semiconductor crystal affects the electron motion by defining allowed and forbidden electronic energy bands. The absence of allowed propagating electromagnetic radiation modes inside the structures, in a range of wavelengths called a photonic band gaps, gives rise to distinct optical phenomena such as inhibition of spontaneous emission, high-reflecting omni-directional mirrors and low-loss-waveguiding amongst others. According to an exemplary embodiment of the invention, vertical nanodiodes may be embedded in a photonic crystal or may be coupled optically, electrically or opto-electrically to a photonic crystal.

The photosensitive device may comprise an electric signal sensing unit adapted for sensing electric signals generated in the plurality of vertically aligned nanowire diodes upon absorption of electromagnetic radiation by the plurality of vertically aligned nanowire diodes. The signal sensing unit may be a monolithically integrated circuit and may be formed in the substrate. Alternatively, the signal sensing unit may be an external circuit provided to control operation of and/or to perform signal evaluation in the photosensitive device. The signal sensing unit may sense electric signals that may be generated when electromagnetic radiation is absorbed by the (depletion portions of the) nanowires, for instance since this may cause the generation of electron-hole pairs. The current value may be then a measure for the impinging electromagnetic radiation, particularly in a wavelength range in which an assigned one of the nanowires is sensitive.

The photosensitive device may comprise an electric signal processing unit adapted for processing the sensed electric signals to derive information regarding the electromagnetic radiation (for instance to determine a wavelength of essentially monochromatic radiation or to determine a spectral characteristic of polychromatic radiation) absorbed by the plurality of vertically aligned nanowire diodes. Thus, such an electric signal processing unit may be a CPU (central processing unit) or a microprocessor and may be provided separately or in common with the electric signal sensing unit. The signals may be processed to obtain information regarding intensity, spectral composition or other properties of the electromagnetic radiation.

The electric signal processing unit may comprise a logic circuitry. The logic circuitry may combine the outputs from each individual nanowire diode or from individual groups of nanowire diodes, may apply a certain Boolean Logic function (such as XOR, AND, etc.) and may then output—with very low computational burden—a signal which is indicative of the properties of the electromagnetic radiation, particularly indicative of a wavelength of electromagnetic radiation.

The electric signal processing unit may be adapted for weighting the electric signals to compensate different electromagnetic radiation absorption characteristics resulting from different diameters of different ones of the plurality of vertically aligned nanowire diodes. Without wishing to be bound to a specific theory, it is presently believed that the thickness/diameter of the nanowires has an impact on the absorption capabilities of the nanowires. As a rule of thumb, the thicker the nanowires, the stronger the absorption effects. In order to eliminate artefacts resulting from the different sensitivity of different nanowires, it is possible to compensate such differences by electric processing, so that diameters and corresponding absorption characteristics may be stored in a memory coupled to the electric signal processing unit. This may further allow improving the accuracy.

Additionally or alternatively, the nanowire diodes may be grouped to form groups of nanowire diodes so that nanowire diodes of a group have essentially the same diameter. The groups may be formed in a manner to compensate different electromagnetic radiation absorption characteristics resulting from different diameters to different ones of the plurality of vertically aligned nanowire diodes. For instance, when thin nanowires are less sensitive than thick nanowires, a group of thinner diodes having the same diameter and being therefore sensitive to the same wavelength may be grouped and may be configured so that the signal amplitude of this group of nanowires equals to a signal amplitude of a single one or a smaller number of nanowires having a larger diameter. Therefore, also the design and the grouping of the diameters of the nanowires may efficiently suppress such artefacts.

A biasing unit (such as a current or voltage source) may be provided and adapted for optionally and selectively applying a biasing signal to the plurality of vertically aligned nanowire diodes. The sensitivity of the nanowire diodes may be improved when biasing the nanowires properly, if desired.

Each of the plurality of vertically aligned nanowire diodes may have a diameter in the range between 1 nm and 5000 nm, more particularly in the range from 5 nm to 1000 nm. A length of the nanowire diodes may be in a range between 100 nm and 5000 nm, more particularly in a range from 500 nm to 10000 nm. However, the aspect ratio of the nanowire diodes may be larger than one, particularly significantly larger than one so as to obtain an oblong nanowire diode.

The photosensitive device may be used as an electro optical member, a photodetector, a spectrally sensitive photodetector, a band-pass analyzer, a single band-pass analyzer, a multiple band-pass analyzer, a high-pass analyzer, a low-pass analyzer, a band-pass filter, a single band-pass filter, a multiple band-pass filter, a high-pass filter or a low-pass filter. A particular field of application of the photosensitive device is the field of detecting electromagnetic radiation in a spectrally resolving manner. Another application is the adaptation of the photosensitive device as an electro optical element which is capable of specifically manipulating electromagnetic radiation, for instance to filter out portions of the electromagnetic radiation spectrum. These applications can also be combined.

The photosensitive device may be manufactured in CMOS technology so that well-known techniques from CMOS can be applied to the manufacture of a photosensitive device, yielding a miniaturized photosensitive device and allowing to manufacture the photosensitive device with low effort and low cost.

The plurality of vertically aligned nanowire diodes may be etched to extend essentially vertically relative to a surface plane of the substrate. By applying etching procedures, it is possible to obtain mechanically stable structures that are manufacturable with reasonable effort.

Alternatively, the plurality of vertically aligned nanowire diodes may also be formed by a growth procedure to extend essentially vertically relative to a surface of the substrate. In order to define the diameter of the nanowires during the growing procedure, it is possible to deposit an array of spots of catalysts material on a substrate for catalyzing the growth of the nanowires. For instance, for growing carbon nanotubes, iron or nickel spots may be used as such a catalyst. By dimensioning the spots in accordance with the desired diameters of the nanowires to be grown on the spots, any structure of nanowire diodes having different diameters may be manufactured easily.

For any method step, any conventional procedure as known from semiconductor technology may be implemented. Forming layers or components may include deposition techniques like CVD (chemical vapour deposition), PECVD (plasma enhanced chemical vapour deposition), ALD (atomic layer deposition), or sputtering. Removing layers or components may include etching techniques like wet etching, vapour etching, etc., as well as patterning techniques like optical lithography, UV lithography, electron beam lithography, etc.

Embodiments of the invention are not bound to specific materials, so that many different materials may be used. For conductive structures, it may be possible to use metallization structures, silicide structures or polysilicon structures. For semiconductor regions or components, crystalline silicon may be used. For insulating portions, silicon oxide or silicon nitride may be used.

The photosensitive device may be formed on a purely crystalline silicon wafer or on an SOI wafer (Silicon On Insulator).

Any process technologies like CMOS, BIPOLAR and BICMOS may be implemented.

The aspects defined above and further aspects of the invention are apparent from the examples of embodiment to be described hereinafter and are explained with reference to these examples of embodiment.

BRIEF DESCRIPTION OF THE DRAWINGS

The invention will be described in more detail hereinafter with reference to examples of embodiment but to which the invention is not limited.

DESCRIPTION OF EMBODIMENTS

Figure 1:
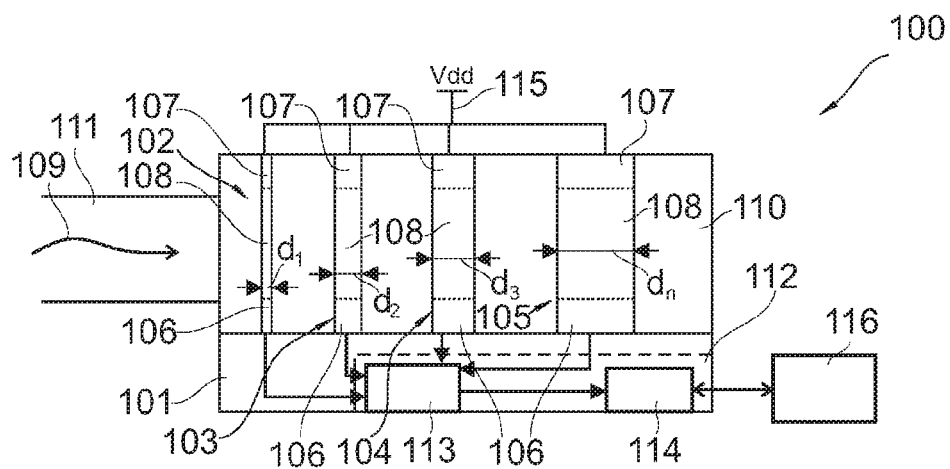
FIG. 1 illustrates a photosensitive apparatus according to an exemplary embodiment of the invention.

The illustration in the drawing is schematical. In different drawings, similar or identical elements are provided with the same reference signs.

In the following, referring to FIG. 1, a photosensitive device 100 according to an exemplary embodiment of the invention will be explained.

The photosensitive device 100 comprises a silicon substrate 101. A plurality of vertically aligned nanowire diodes 102 to 105 is formed on the silicon substrate 101. As can be taken from FIG. 1, the different nanowire diodes 102 to 105 have different diameters $d_1$ to $d_4$ to thereby be sensitive to different spatial portions of electromagnetic radiation, particularly light. The nanowire diodes 102 to 105 are provided parallel to each other and comprise a first end portion 106 being p-doped and comprise a second end portion 107 being n-doped. The substrate 101 in this case is also p-doped.

Between the n-doped portion 107 and the p-doped portion 106, an essentially non-doped or intrinsically doped depletion portion 108 (having a low concentration of charge carriers) is provided, wherein this depletion portion 108 is capable of absorbing electromagnetic radiation 109, such as light, in accordance with a correlation between a corresponding diameter $d_1$ to $d_4$ of the vertically aligned nanowire diodes 102 to 105 and a wavelength λ of the electromagnetic radiation 109. In other words, depending on the wavelength λ or the frequency f of the electromagnetic radiation 109, the sensitivity of the nanowire diodes 102 to 105 differ. Therefore, when the electromagnetic radiation beam 109 is absorbed by each of the nanowires 102 to 105, the absorption characteristic depends on a correlation between the diameter $d_1$ to $d_4$ and the wavelength of the electromagnetic radiation 109.

Electric detection signals that are generated as a consequence of the generation of electron-hole pairs within the nanowires 102 to 105 are detected and processed by a processor 112. The processor 112 in the present case is integrated in the silicon substrate 101. The electric signals may be different for the different nanowires 102 to 105 and may be indicative of the corresponding absorption characteristics of a respective nanowire diode 102 to 105 for the wavelength of the electromagnetic radiation 109.

The nanowires 102 to 105 are embedded in an electrically insulating and optically transparent silicon oxide matrix 102 to provide a mechanical protection, a spatial definition and a proper coupling of a light fiber 111 for guiding the electromagnetic radiation 109 perpendicularly and laterally to the nanowire diodes 102 to 105.

More specifically, the signals generated in the nanowire diodes 102 to 105 upon absorption of the light 109 are supplied to an electric sensing unit 113 for sensing these signals. The processed or sensed signals in the present case are supplied to a compensation and logic circuit 114 (but which is optional). Since the absolute absorption intensity of the diodes 102 to 105 depends on the respective diameter $d_1$ to $d_4$, the compensation circuit 114 compensates for such differences mathematically by selectively amplifying or attenuating the different signals with corresponding correction signals. Furthermore, the signals may be applied to a logic unit in the compensation and logic circuit 114 so as to output a logic result, for instance which wavelength the electromagnetic radiation 109 has, or which wavelength distribution the light 109 has.

Such output information OI is provided to an input/output unit 116. Via the input/output unit 116, a user may get information detected by the device 100, or may provide control signals to operate the device 100 in accordance with user preferences. The input/output unit 116 may comprise a display unit such as an LCD display, a cathode ray tube, a plasma device, etc. Furthermore, the input/output device 116 may comprise input elements such as a button, a keypad, a joystick, or even a microphone of a voice recognition system.

In the present case a biasing unit 115 provides an electrical potential Vdd to provide the nanowire diodes 102 to 105 with electric biasing signals for promoting operability of the device.

Figure 2:
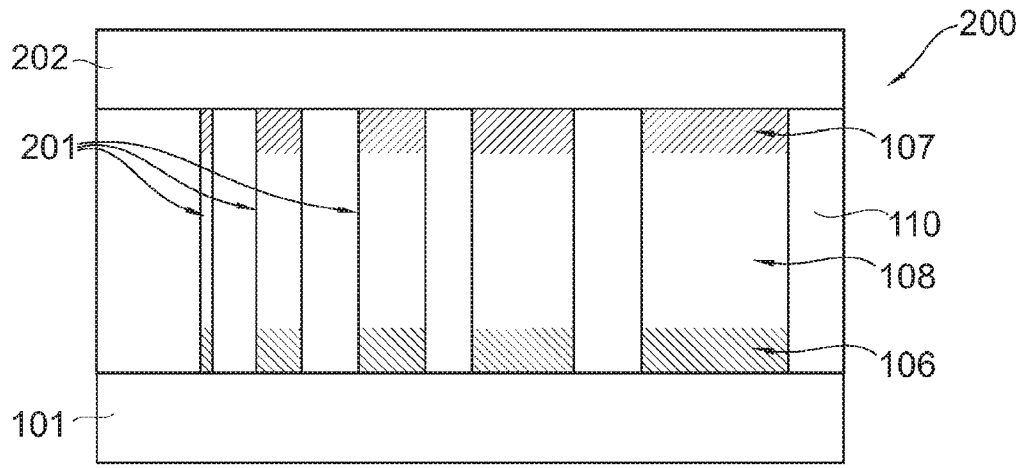
FIG. 2 shows a cross-sectional view of a photosensitive device according to an exemplary embodiment of the invention.
Figure 3:
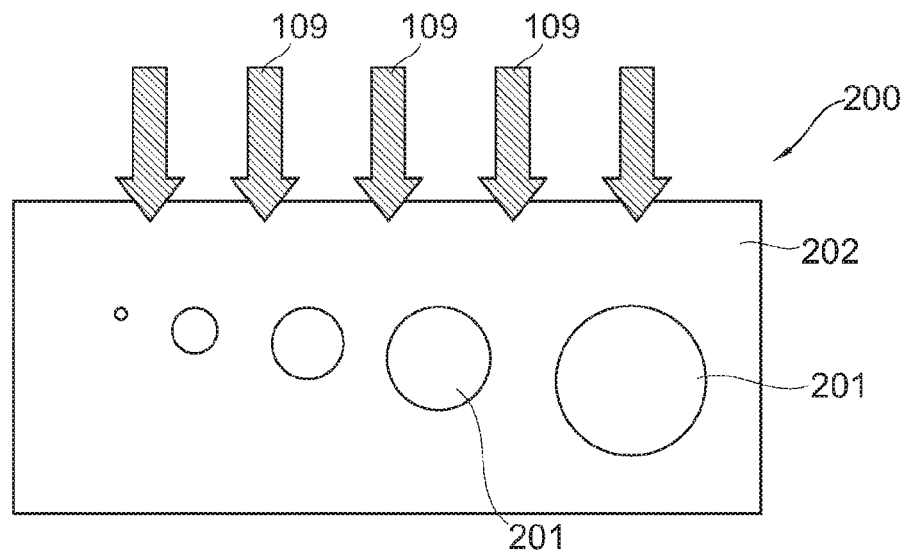
FIG. 3 shows a plan view of the photosensitive device of FIG. 2 according to the exemplary embodiment of the invention.

FIG. 2 and FIG. 3 show a cross-sectional view (FIG. 2) and a plan view (FIG. 3) of a photosensitive device 200 according to another exemplary embodiment of the invention.

FIG. 2 shows five nanodiodes 201 and again shows the anode 107 and the cathode 106 separated by the depletion volume 108. A contact layer 202 is shown as well.

The plan view of FIG. 3 shows that the nanowires 201 are cylindrical nanowires. A lateral incident light direction is indicated by reference numeral 109.

The nanowire photodiodes 201 are cylindrical elements of silicon (or another semiconductor material), and may be manufactured as described further below. They comprise or consist of a cathode region 106 (n-type doped) at the bottom (connected to the substrate 101, of the same doping type), and an anode 107 (p-type doped) region at the top of the nanowire 201. The anode 107 is electrically connected at the top. Between the cathode 106 and the anode 107, a depletion volume 108 is formed, like in any diode. This region 108 is the sensitive part of the device 200. The cathode 106 and the anode 107 can be interchanged, for instance for practical (such as manufacturing) reasons.

Typical dimensions are 5 nm to 1000 nm for the diameter of the diodes 201 and 500 nm to 10000 nm for the vertical dimension of the diodes 201. The cylindrical structures 201 may have a specially conditioned surface to reduce or minimize the amount of surface recombination. The cylinders 201 are embedded in silicon oxide material 110, or another suitable dielectric during the manufacturing process.

Light 109 is incident laterally on these photodiodes 201, and propagates freely through the dielectric 110. When the light 109 reaches the silicon pillars 201, it will be absorbed. The fraction of incident photons 109 absorbed depends on the diameter of the cylinders 201.

Once absorbed in the silicon cylinder 201, these photons 109 may generate electron-hole pairs that constitute a measurable current between two electrodes. However, the amount of current generated depends on the cylinder diameter, as seen in FIG. 4.

Figure 4:
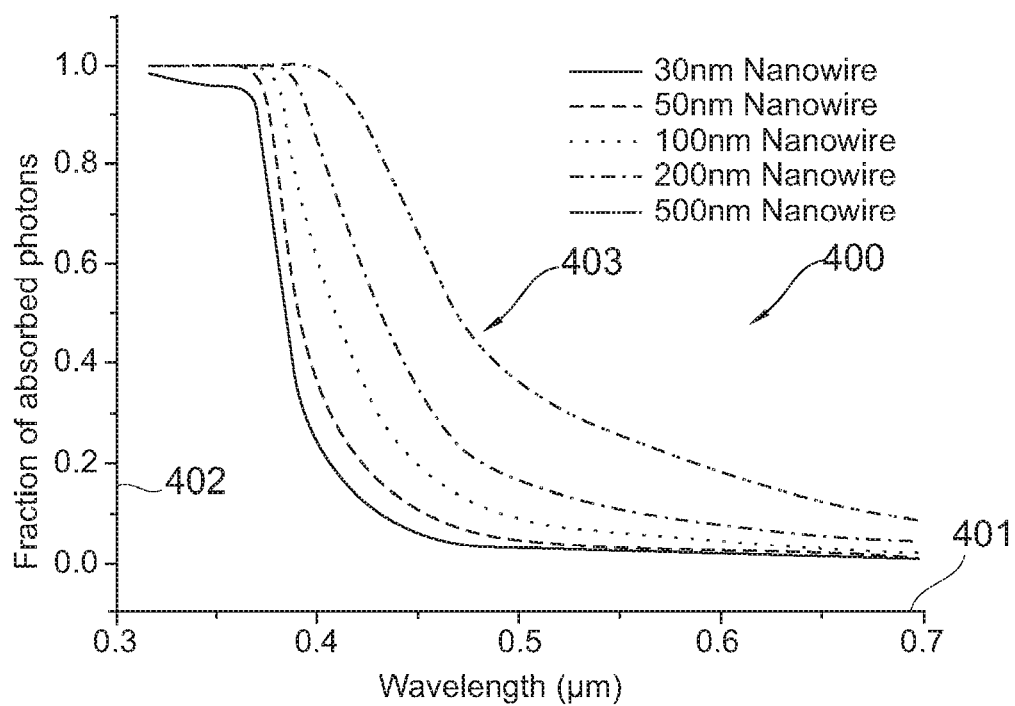
FIG. 4 shows a diagram illustrating a correlation between a wavelength of electromagnetic radiation and a fraction of absorbed photons for nanowires having different diameters.

FIG. 4 shows a diagram 400 having an abscissa 401 along which a wavelength of electromagnetic radiation is plotted. Along an ordinate 402, a fraction of absorbed photons is shown. Different curves 403 relate to the characteristics of nanowires having different diameters.

For instance, a 450 nm photon will not be absorbed by a 30 nm nanowire, whereas a 500 nm cylinder will absorb it. In other words, a 450 nm photon will not lead to substantial current in a 30 nm nanowire, but will generate a current in a larger diameter photodiode.

Generally it is believed that the polarization component parallel to the cylinders is absorbed, since in the other direction the wire diameter is much smaller than the wavelength.

Figure 5:
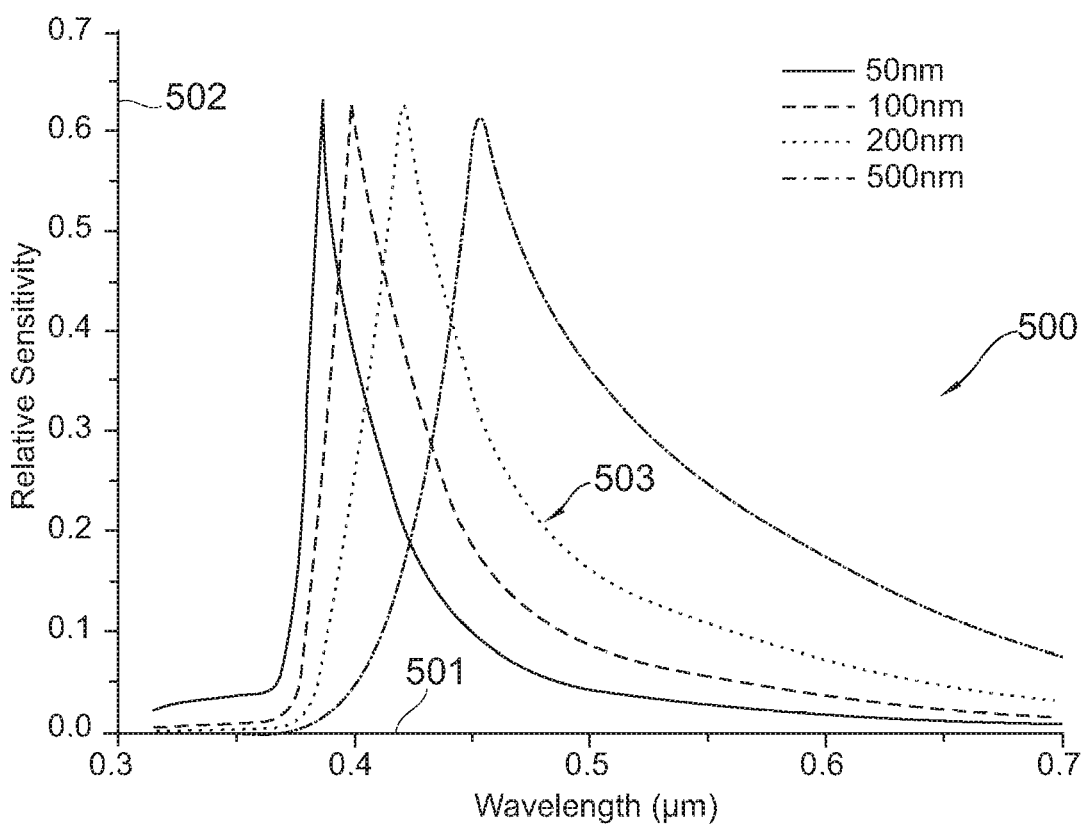
FIG. 5 shows a diagram illustrating a correlation between a wavelength of electromagnetic radiation and a relative sensitivity of nanowires having different diameters.

FIG. 5 shows a diagram 500 having an abscissa 501 along which a wavelength of electromagnetic radiation is plotted. Along an ordinate 502, a relative sensitivity is shown. Different curves 503 relate to the characteristics of nanowires having different diameters.

Suitable logic combinations of the current response may construct a spectrally resolving system of photodiodes. As an illustration, FIG. 6 shows an exclusive OR (XOR) combination of the 50 nm and the 100 nm current responses.

Figure 6:
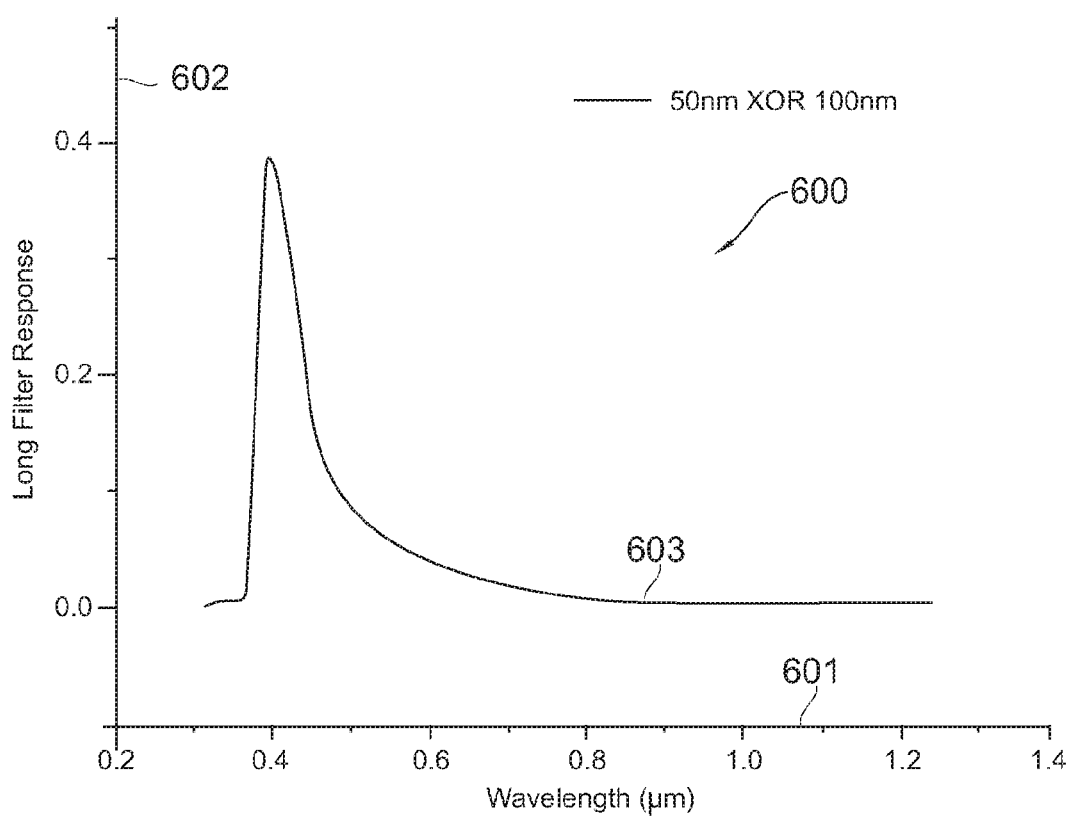
FIG. 6 shows a diagram illustrating a correlation between a wavelength of electromagnetic radiation and an output of a logic filter according to the exemplary embodiment of the invention.

FIG. 6 shows a diagram 600 having an abscissa 601 along which a wavelength of electromagnetic radiation is plotted. Along an ordinate 602, a logic filter response is shown. A curve 603 has a peak like characteristic allowing deriving information regarding the electromagnetic radiation.

In this way, single and multiple band-pass analyzers, as well as high-pass and low-pass filters can be constructed.

The diodes may have different absolute current levels due to their different diameters (different exposed areas and different maximum photo-currents). This can be compensated by arranging multiple smaller cylinders, such that the total response is the same, and/or by tuning the logic amplification correctly to compensate for the different currents.

The cylinders may be arranged in a staggered way, so that the total absorption probability of the incident light is high.

There are several ways to ensure that light is being incident laterally, instead of a top (or bottom) incidence. Light from the top can be coupled in from the top by using a holographic lens and waveguides (Luxtera). Light from a fibre can also be coupled into a chip directly laterally. Another interesting use of embodiments of the present invention is as the active component in a photonic crystal, which propagates light laterally.

The photodiodes can be unbiased (photo-voltaic regime), slightly reverse biased (pin diode regime), biased just below breakdown (avalanche regime), or just above breakdown (Geiger-mode regime). All these different bias conditions may be useful in different applications.

In the following, manufacture of nanowire diodes will be explained in more detail. Such manufacture techniques may provide for a breakdown enhancement in silicon nanowire pn-junctions.

In order to experimentally manufacture nanowire diodes, silicon VLSI techniques may be used to realize pn-junctions on a silicon wafer. It is possible to start with n-type doped wafers (8" Electronic Grade Si, <100> Czochralski, $\rho$~3 m$\Omega$ cm, or $N_{As}$~$2\times10^{19}$ cm$^{-3}$, 500 nm lowly doped epitaxial layer; from Wacker Siltronic). Into these wafers, it is possible to implant Boron ions to form a highly doped anode and to anneal out the implant damage (0.5 keV, $10^{15}$ atoms/cm$^2$, 1100° C. spike anneal, 0 sec soak time). A Halogen-based inductively coupled plasma-etch may be performed to form the nanowires. An anneal step in hydrogen ambient may be used to repair and passivate the surface of the etched nanowire. The etched and annealed wires may be embedded in $SiO_2$ using a combination of densified tetraethoxysilane (TEOS) and high-density plasma assisted oxide. Chemical-mechanical polishing may be used to planarize the structures. After exposing the nanowire tips by using 2% HF acid, the tips may be cleaned and rendered hydrophobic (Ozone gas, diluted HF, Marangoni dry). Chemical vapour deposition may then be used to deposit ~150 nm of in-situ boron-doped poly-silicon (typically $\rho$<1 m$\Omega$ cm), with minimal interfacial oxide formation. After patterning of contact pads (200 $\mu$m×200 $\mu$m), the top of the poly-silicon film may be converted to NiSi using sputtered Ni annealed at 450° C. Both these contact pads and the backside of the wafer may be further metallized with evaporated Aluminium.

Figure 7:
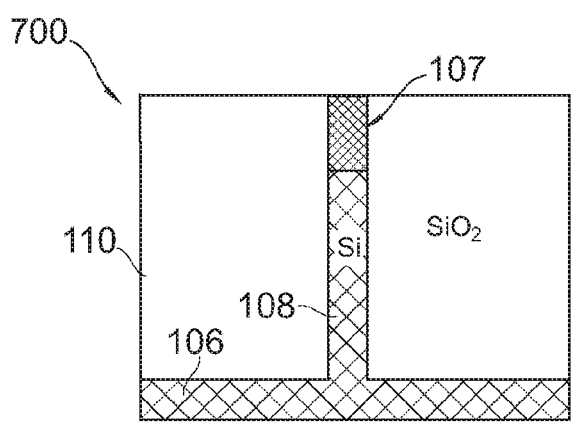
FIG. 7 illustrates a schematic sketch of an etched nanowire junction device.

FIG. 7 is a schematic illustration 700 of manufactured nanowire diodes.

Figure 8:
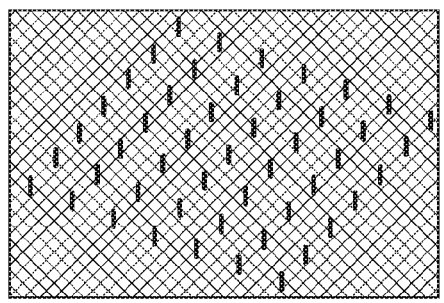
FIG. 8 illustrates a scanning electron micrograph of an array of 50 silicon nanowires, after reactive ion etching.
Figure 9:
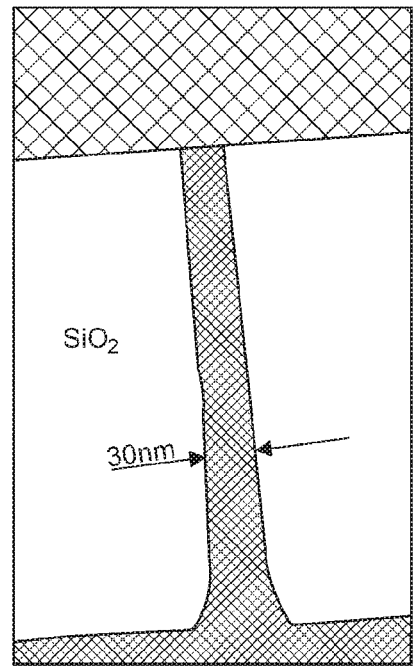
FIG. 9 illustrates a transmission electron micrograph of a single 30 nm silicon nanowire, wherein, at the tip of the nanowire, the polysilicon contact layer has recrystallized to form a low-resistance ohmic contact.

Transmission electron micrographs (FIG. 8, FIG. 9) show that the smallest devices shown there have a uniform diameter of ~30 nm (aspect ratio~1:10), with excellent crystallinity and negligible tapering. In particular, no morphological trace of residual implant damage is seen in the devices.

From an analysis of the manufacturing process it is possible to estimate the junction depth to be about 100 nm below the top end (anode) of the nanowires. The electron micrographs also indicate that the poly-silicon contact layer has recrystallized around the tip of the nanowire during one of the thermal anneal steps in the process.

Figure 10:
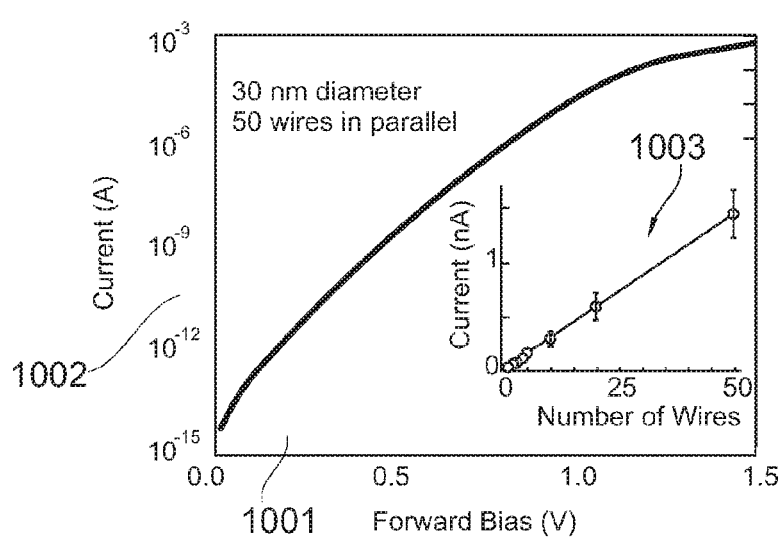
FIG. 10 illustrates a forward-bias diode characteristics of an array of 50 nanowire diodes, each having a 30 nm diameter, wherein an inset shows a scaling plot of a forward bias current versus a number of nanowires per contact (error bars are ±1σ from a sample of 29 dies).

FIG. 10 shows a diagram 1000 having an abscissa 1001 along which a forward bias voltage is plotted. Along an ordinate 1002, a current is shown.

In FIG. 10, the forward bias current-voltage characteristics of an array of 50 nanowire diodes is shown, each ~30 nm wide. The devices show diode characteristics over 11 decades in current with a maximum current density of about 1600 kA/cm$^2$ per wire, assuming uniform current flow over the whole wire diameter. The absence of a bias-independent leakage current indicates that the surface has been effectively passivated. These characteristics are highly reproducible, and the forward bias current is proportional to the number of wires per bondpad (see inset 1003).

A study of twenty-nine (29) different sites on the wafer shows a spread of about 20% in the forward current.

Figure 11:
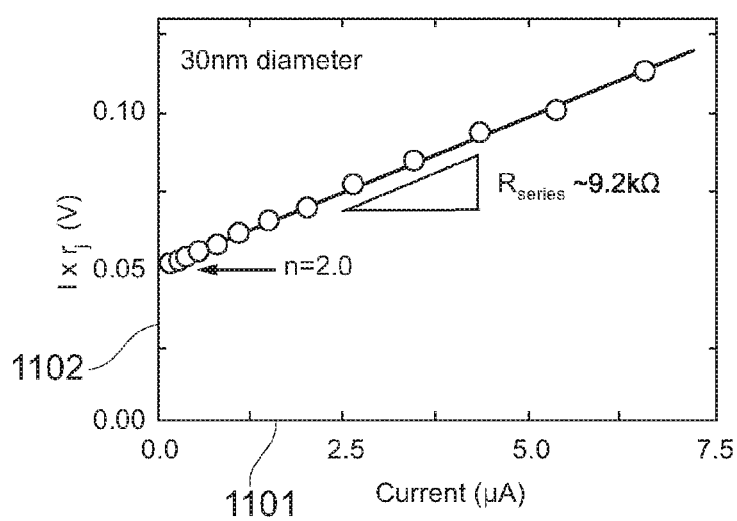
FIG. 11 illustrates an ideality factor and a series resistance for one individual diode, extracted at high forward currents.

FIG. 11 shows a diagram 1100 having an abscissa 1101 along which a current is plotted. Along an ordinate 1102, the ideality factor and series resistance are shown.

FIG. 11 shows the product of the current I as well as the differential resistance $r_j = dV/dI$ at high currents, for one individual 30 nm diode. According to standard diode theory, $r_j I = n v_{th} + R_{ser} I$, where n is the diode ideality factor, $v_{th}$ is the thermal voltage and $R_{ser}$ is the diode series resistance. For the typical diode shown in FIG. 11, it is possible to extract a diode series resistance of $R_{ser} \approx 9.2$ k$\Omega$, and an ideality factor of n=2.0. Depending on the actual contact area in this particular device, it is possible to estimate the specific contact resistance to be in the range of 6–20 $\Omega\mu m^2$. In the manufactured devices, the depletion volume is typically less than ~4×10$^{-17}$ cm$^3$.

Figure 12:
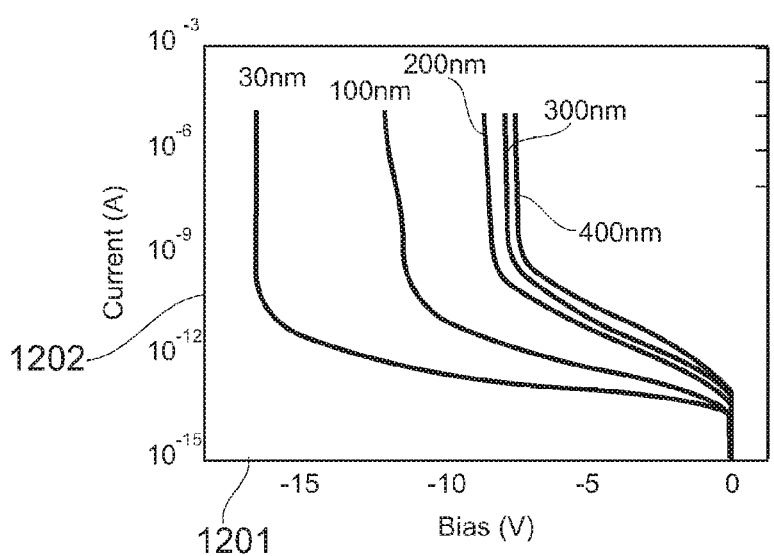
FIG. 12 illustrates the reverse-bias diode characteristics for devices of various diameters.

Next, the behaviour at reverse bias will be discussed, where significant differences for different diode diameters may be observed, as shown in FIG. 12.

FIG. 12 shows a diagram 1200 having an abscissa 1201 along which a bias voltage is plotted. Along an ordinate 1202, a current is plotted.

For the structures which are ~500 nm in diameter, the breakdown voltage is around 7.6V. As the lateral dimension of the diode is reduced to 30 nm, the breakdown voltage in increased by more than a factor 2 to 16.9 V.

Figure 13:
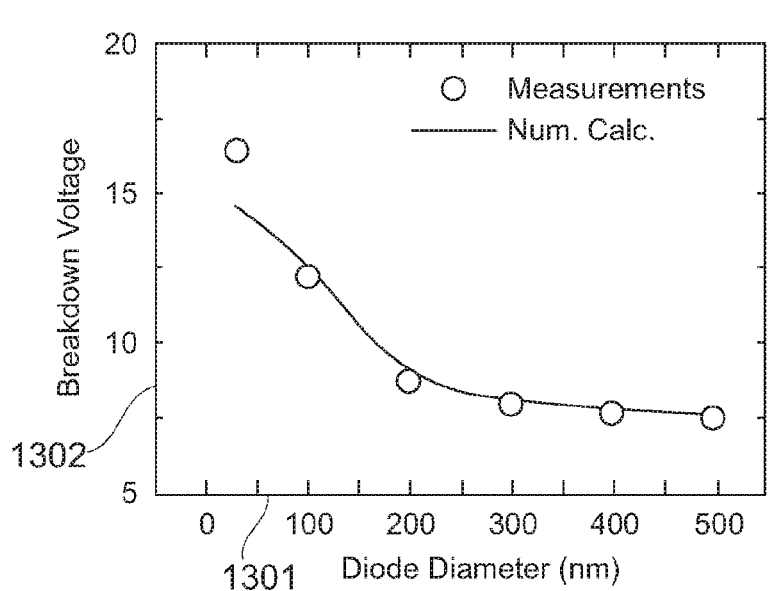
FIG. 13 illustrates measured (dots) and calculated (lines) breakdown voltages as a function of nanowire diameter.

In FIG. 13, the diameter dependence of the breakdown voltage is shown, along with numerical calculations. FIG. 13 shows a diagram 1300 having an abscissa 1201 along which a diode diameter is plotted. Along an ordinate 1302, a breakdown voltage is plotted.

This breakdown enhancement may be ascribed primarily to the influence of the surrounding dielectric on the electric field profile in the silicon nanowire pn junction itself. In essence, the anode contact defined by the polysilicon contact layer and the highly doped substrate form two large capacitor plates. The medium between these capacitor plates is almost entirely SiO$_2$ dielectric, and the 30 nm silicon nanowires make up less than 1% of the area. The field distribution away from the silicon nanowires is thus uniform, with the equally spaced equipotential planes typical of a simple capacitor. At the boundary between the embedding dielectric and the silicon nanowires, the continuity requirements of the electrostatic field and displacement smooth out the electric field profile inside the junction and suppress the field peak responsible for the avalanche breakdown of the diode.

Figure 14:
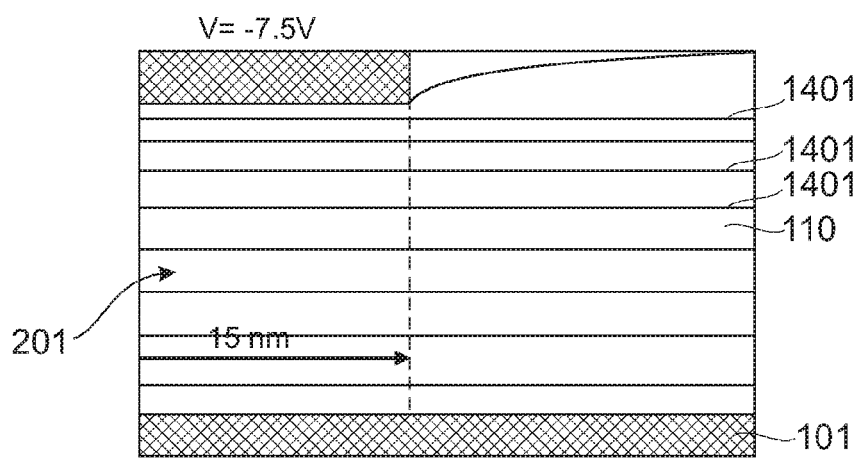
FIG. 14 illustrates calculated electrostatic equipotential lines in the vicinity of the nanowire (the spacing equals to 1V).
Figure 15:
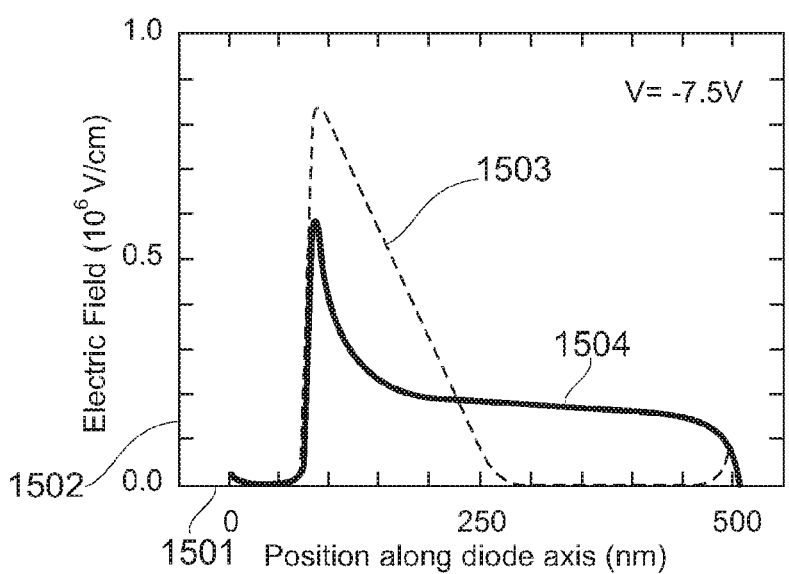
FIG. 15 illustrates a calculated electric field profile along the symmetry axis of a wire (solid line), and the equivalent field profile for a planar diode (dashed line) at a reverse bias of −7.5V.

This effect can be modelled with numerical solutions to Poisson's equation in the semiconductor and dielectric using the appropriate boundary conditions and the results are shown as the line in FIG. 13, in a scheme 1400 of FIG. 14, and in FIG. 15.

For the calculations, it was assumed a one sided junction with a uniform donor concentration of ~3×10$^{17}$ cm$^{-3}$, which is in agreement with the breakdown voltage for the 500 nm diodes. Apart from this parameter, no other adjustments are made, and the solutions to Poisson's equation are calculated in cylindrical coordinates for various diode diameters. The breakdown voltage is then calculated from the impact ionization integral.

FIG. 14 shows equipotential lines 1401 in the vicinity of the nanowire diode 201 at a reverse bias close to the breakdown voltage of the equivalent planar diode. It shows how the electrostatic potential changes from the uniform distribution of the dielectric 110 to the field profile inside the semiconductor junction. Inside the dielectric 110, the width over which the electric field deviates strongly from the uniform field is of the order of 35 nm. This indicates that the breakdown enhancement effect seen here should persist for very densely packed nanowire diodes.

A comparison between the electric field in the nanowire diode 201 and a conventional planar diode is shown in FIG. 15.

FIG. 15 shows a diagram 1500 having an abscissa 1501 along which a position along a diode axis is plotted. Along an ordinate 1502, an electric field is plotted. A first curve 1503 relates to a planar diode. A second curve 1504 relates to an embedded nanowire diode.

The smearing out of the field distribution and the resulting reduction in the electric field peak near the metallurgical junction is clearly seen.

Although the simple model can reproduce the breakdown enhancement well, as shown in FIG. 12, it cannot give complete quantitative agreement with our measurements at the smallest diameter. This may well be due to effects not included in the model, such as strain in the semiconductor, fixed charges in the dielectric, a reduction of avalanche generation due to the proximity of the surface, short-comings of the standard avalanche model, or indeed uncertainties in the doping profiles of the devices. Quantum effects such as bandgap widening, modified phonon scattering rates or effects due to a 1D density-of-states can also be expected to modify breakdown voltages in a nanowire. However, these effects are thought to appear at smaller nanowire diameters in silicon. Unambiguous identification of these quantum effects on device behaviour will require similarly controlled and reproducible nanowire technologies, at smaller diameters.

Thus, high-quality embedded silicon nanowire pn-junction diodes are manufactured with diameters down to 30 nm or less. The diodes show an enhancement in their breakdown voltages by a factor of ~2 over their planar equivalent. The potential landscape that charge carriers experience in these devices is controlled by the surrounding dielectric, which smears out of the electric field inside the semiconductor junction. This in turn results in the suppression of avalanche breakdown.

It has also been demonstrated that "top down" manufacturing techniques are capable of producing high quality nanowire junction devices, without any problems of placement or integration of wires, or indeed of contamination due to metallic precursors. A contact technology based on recrystallized poly-silicon is also possible. This technique can be extended to even smaller nanowire diameters, and it may be suitable for the realization of a large range of junction based devices, as well as a suitable experimental test bed for quantum effects in even smaller nanowire devices.

One aspect during manufacture is the surface treatment in Hydrogen ambient. This is thought to ensure a low surface recombination velocity at the surface, resulting in better photo-diode sensitivity. Typical conditions for this hydrogen ambient are 950° C., 2 minutes at atmospheric pressure. The efficiency of the passivation may be enhanced if the substrate is doped with Arsenic and exposed to the Hydrogen anneal as well. In this case, Arsenic atoms may desorb from the substrate and redeposit as a monolayer on the nanowire surface, resulting in good surface passivation. This may further improve the photodiode performance.

Other semiconductors, such as Germanium, can also be used as the starting material. Generally, the etching method for preparing nanowires may be preferred compared to the growth method, because of the ease of manufacturing position controlled, dense arrays of variable diameters, the compatibility with existing VLSI processes, and the absence of metallic precursors which can act as contaminants in the sensitive region of the device, and lead to large leakage currents.

Finally, it should be noted that the above-mentioned embodiments illustrate rather than limit the invention, and that those skilled in the art will be capable of designing many alternative embodiments without departing from the scope of the invention as defined by the appended claims. In the claims, any reference signs placed in parentheses shall not be construed as limiting the claims. The word "comprising" and "comprises", and the like, does not exclude the presence of elements or steps other than those listed in any claim or the specification as a whole. The singular reference of an element does not exclude the plural reference of such elements and vice-versa. In a device claim enumerating several means, several of these means may be embodied by one and the same item of software or hardware. The mere fact that certain measures are recited in mutually different dependent claims does not indicate that a combination of these measures cannot be used to advantage.

The invention claimed is:

1. A photosensitive device, the photosensitive device comprising:
    a substrate;
    a plurality of vertically aligned nanowire diodes; and
    a compensation circuit, wherein different signals from the plurality of vertically aligned nanowire diodes are compensated based upon different diameters of the plurality of vertically aligned nanowire diodes.

2. The photosensitive device according to claim 1, wherein the plurality of vertically aligned nanowire diodes are arranged in parallel to each other.

3. The photosensitive device according to claim 1, wherein each of the plurality of vertically aligned nanowire diodes comprises:
    a first end portion having a first type of conductivity; and
    a second end portion having a second type of conductivity.

4. The photosensitive device according to claim 3, wherein the first type of conductivity is different from the second type of conductivity.

5. The photosensitive device according to claim 3, wherein each of the plurality of vertically aligned nanowire diodes comprises:
    a depletion portion between the first end portion and the second end portion, wherein the depletion portion is configured to absorb electromagnetic radiation in dependence of a correlation between a diameter of the respective vertically aligned nanowire diode and a wavelength of the electromagnetic radiation.

6. The photosensitive device according to claim 3, wherein the substrate is connected to the first end portion and has the first type of conductivity.

7. The photosensitive device according to claim 1, comprising:
    an electrically insulating matrix in which the plurality of vertically aligned nanowire diodes are embedded.

8. The photosensitive device according to claim 1, comprising:
    an electromagnetic radiation guiding element configured to guide electromagnetic radiation to impinge on the plurality of vertically aligned nanowire diodes in a direction perpendicular to an alignment direction of the plurality of vertically aligned nanowire diodes.

9. The photosensitive device according to claim 8, wherein the electromagnetic radiation guiding element comprises at least one of a group consisting of a holographic lens, a waveguide, an optical fiber, and a photonic crystal material.

10. The photosensitive device according to claim 1, comprising:
    an electric signal sensing unit configured to sense electric signals generated by the plurality of vertically aligned nanowire diodes upon absorption of electromagnetic radiation by the plurality of vertically aligned nanowire diodes.

11. The photosensitive device according to claim 10, comprising:
    an electric signal processing unit configured to process the sensed electric signals to derive spectral information regarding the electromagnetic radiation absorbed by the plurality of vertically aligned nanowire diodes.

12. The photosensitive device according to claim 11, wherein the electric signal processing unit comprises:
    a logic circuitry configured to process the electric signals in accordance with a predefined logic function to derive spectral information regarding the electromagnetic radiation.

13. The photosensitive device according to claim 11, wherein the electric signal processing unit is configured to weight the electric signals to at least partially compensate different electromagnetic radiation absorption characteristics resulting from different diameters of different ones of the plurality of vertically aligned nanowire diodes.

14. The photosensitive device according to claim 1, wherein the plurality of vertically aligned nanowire diodes are grouped to form groups of nanowire diodes so that nanowire diodes of each formed group have the same diameter, and the groups are formed in a manner to at least partially compensate different electromagnetic radiation absorption characteristics resulting from different diameters of different ones of the plurality of vertically aligned nanowire diodes.

15. The photosensitive device according to claim 1, further comprising:
    a biasing unit configured to electrically bias the plurality of vertically aligned nanowire diodes.

16. The photosensitive device according to claim 1, wherein each of the plurality of vertically aligned nanowire diodes has a diameter in a range between 5 nm and 1000 nm.

17. The photosensitive device according to claim 1, wherein each of the plurality of vertically aligned nanowire diodes has a length in a range between 500 nm and 10000 nm.

18. The photosensitive device according to claim 1, adapted as one of a group consisting of an electro optical member, a photodetector, a spectrally sensitive photodetector, a band-pass analyzer, a single band-pass analyzer, a multiple band-pass analyzer, a high-pass analyzer, a low-pass analyzer, a band-pass filter, a single band-pass filter, a multiple band-pass filter, a high-pass filter, and a low-pass filter.

19. The photosensitive device according to claim 1, manufactured in Complementary Metal Oxide Semiconductor (CMOS) technology.

20. The photosensitive device according to claim 1, wherein the substrate comprises a semiconductor material of a group consisting of a group IV semiconductor and a group III-group V semiconductor.

21. The photosensitive device structure according to claim 1, wherein the plurality of vertically aligned nanowire diodes comprise one of a group consisting of a semiconductor nanowire, a carbon nanotube, a silicon nanowire, and a group III-group V nanowire.

22. The photosensitive device according to claim 1, comprising a photonic crystal, wherein the plurality of vertically aligned nanowire diodes are embedded in or are functionally coupled to the photonic crystal.

23. A method of using the photosensitive device of claim 1 for detecting electromagnetic radiation impinging in a direction being perpendicular to an alignment direction of the vertically aligned nanowire diodes.

24. A method of using the photosensitive device of claim 1 for manipulating electromagnetic radiation impinging in a direction being perpendicular to an alignment direction of the vertically aligned nanowire diodes.

25. A method of manufacturing a photosensitive device, the method comprising:
  providing a substrate;
  forming a plurality of vertically aligned nanowire diodes; and
  compensating different signals from the formed plurality of vertically aligned nanowire diodes based upon different diameters of the formed plurality of vertically aligned nanowire diodes.

26. The method according to claim 25, further comprising:
  forming the plurality of vertically aligned nanowire diodes by etching to extend essentially vertically relative to a surface plane of the substrate.

27. The method according to claim 25, further comprising:
  forming the plurality of vertically aligned nanowire diodes by growing to extend essentially vertically relative to a surface plane of the substrate.

* * * * *